United States Patent
Kook et al.

(10) Patent No.: US 7,511,562 B2
(45) Date of Patent: Mar. 31, 2009

(54) HIGH VOLTAGE GENERATING CIRCUIT PRESERVING CHARGE PUMPING EFFICIENCY

(75) Inventors: Jeong-hoon Kook, Seoul (KR); Jung-hwa Lee, Suwon-si (KR); Jung-suk Kim, Seoul (KR); Dae-hwan Kim, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/865,861

(22) Filed: Oct. 2, 2007

(65) Prior Publication Data

US 2008/0024201 A1 Jan. 31, 2008

Related U.S. Application Data

(62) Division of application No. 11/103,647, filed on Apr. 12, 2005, now Pat. No. 7,295,058.

(30) Foreign Application Priority Data

Apr. 12, 2004 (KR) ........................ 10-2004-0024893
May 27, 2004 (KR) ........................ 10-2004-0037688

(51) Int. Cl.
*G05F 1/10* (2006.01)
(52) U.S. Cl. ........................ 327/536; 327/537
(58) Field of Classification Search ........................ None
See application file for complete search history.

(56) References Cited

U.S. PATENT DOCUMENTS

| 5,266,842 | A | | 11/1993 | Park |
| 5,483,188 | A | * | 1/1996 | Frodsham ........................ 327/170 |
| 5,936,459 | A | | 8/1999 | Hamamoto |
| 6,177,828 | B1 | | 1/2001 | Kang et al. |
| 6,456,152 | B1 | * | 9/2002 | Tanaka ........................ 327/536 |
| 6,522,191 | B1 | * | 2/2003 | Cha et al. ........................ 327/536 |
| 6,532,177 | B1 | * | 3/2003 | Butler ........................ 365/189.09 |
| 6,683,488 | B2 | * | 1/2004 | Jin ........................ 327/536 |
| 6,710,617 | B2 | * | 3/2004 | Humphrey ........................ 326/30 |
| 6,903,600 | B2 | | 6/2005 | Blodgett |
| 2002/0014909 | A1 | * | 2/2002 | Akita et al. ........................ 327/536 |
| 2003/0025548 | A1 | * | 2/2003 | Jang ........................ 327/390 |
| 2003/0076156 | A1 | * | 4/2003 | Shim ........................ 327/536 |

FOREIGN PATENT DOCUMENTS

| JP | 10208489 | 8/1998 |
| KR | 0000026486 A | 5/2000 |
| KR | 1020030002813 A | 1/2003 |

* cited by examiner

*Primary Examiner*—Tuan T Lam
(74) *Attorney, Agent, or Firm*—Volentine & Whitt, PLLC

(57) ABSTRACT

A high voltage generating circuit is disclosed. In the high voltage generating circuit a boost node is precharged and boosted by a plurality of pump circuits and then discharged to an output terminal. Where a voltage apparent at the boost node is smaller than a power supply voltage, the voltage apparent at the boost node is elevated to the power supply voltage. Where the voltage apparent at the boost node is larger than the power supply voltage, a current path is prevented from forming between the boost node and the power supply voltage so as to maintain the voltage apparent at the boost node.

10 Claims, 13 Drawing Sheets

HIGH VOLTAGE GENERATING CIRCUIT PRESERVING CHARGE PUMPING EFFICIENCY

CROSS-REFERENCE TO RELATED APPLICATION

This is a divisional of application Ser. No. 11/103,647 filed on Apr. 12, 2005, now U.S. Pat. No. 7,295,058, which is incorporated herein by reference in its entirety.

BACKGROUND OF THE INVENTION

1. Field of the Invention

The present invention relates generally to a semiconductor integrated circuit, and more particularly, to a high voltage generating circuit preserving charge pumping efficiency.

2. Description of the Related Art

A high-density Dynamic Random Access Memory (DRAM) typically operates at a low power supply voltage of 1.5 V or 1.8 V. Unfortunately, the low power supply voltage tends to cause sluggishness in the performance of the DRAM circuit. For example, the low power supply voltage generally causes sense amplifiers to operate slowly and bit lines to precharge slowly. In order to address these and other issues, a DRAM typically provides a boosted voltage of 3.0 V or more to a word line, a bit line, or a sense amplifier. The boosted voltage is typically provided by boosting the low power supply voltage of the DRAM using a high voltage generating circuit.

A high voltage generating circuit providing a boosted voltage is disclosed, for example, in U.S. Pat. No. 6,414,882.

FIG. 1 illustrates a conventional high voltage generating circuit.

Referring to FIG. 1, a high voltage generating circuit 500 comprises pump circuits 504a and 504b. Pump circuits 504a and 504b operate in a cooperative manner such that an output node VCCP of charge pump circuit 500 is driven by only one of pump circuits 504a or 504b at any given time.

Pump circuits 504a and 504b are coupled so that whenever output node VCCP is driven by pump circuit 504b, excess charge apparent at a boost node 522b in pump circuit 504b is discharged into a boost node 522a in pump circuit 504a. As a consequence, charge in high voltage generating circuit 500 is conserved, and therefore, an output current of high voltage generating circuit 500 is maintained, thus reducing power consumption. Boost nodes 522a and 522b are precharged by a power supply having a power supply voltage VCC.

FIG. 2 is a waveform timing diagram illustrating the operation of the high voltage generating circuit shown in FIG. 1.

Referring to FIG. 2, a precharge transistor 524a is turned on by a signal P2B2 between times t2 and t3, thus precharging boost node 522a to power supply voltage VCC. Between times t2 and t3, a current path is formed between boost node 522a and the power supply via precharge transistor 524a. Where a voltage apparent at boost node 522a is larger than power supply voltage VCC, the voltage apparent at boost node 522a is reduced to power supply voltage VCC, as illustrated by a solid line P1A in FIG. 2. Reducing the voltage apparent at boost node 522a reduces charge pumping efficiency in high voltage generating circuit 500. Accordingly, there is a need to develop a high voltage generating circuit preserving charge pumping efficiency.

SUMMARY OF THE INVENTION

The present invention provides a high voltage generating circuit capable of improving charge pumping efficiency at a high power supply voltage and at a low power supply voltage.

According to one aspect of the present invention, a high voltage generating circuit is provided. The high voltage generating circuit comprises first through third pump circuits and first through fourth switches.

The first pump circuit precharges a first boost node to a power supply voltage in response to a first precharge signal, and boosts the first boost node in response to a first pump signal. The second pump circuit precharges a second boost node to the power supply voltage in response to the first precharge signal, boosts the second boost node in response to the first pump signal, precharges a third boost node in response to a second precharge signal, and boosts the third boost node in response to a second pump signal. The third pump circuit boosts a fourth boost node in response to a third pump signal.

The first switch connects the second boost node to the third boost node in response to a first switch signal. The second switch connects the first boost node to the fourth boost node in response to the first switch signal. The third switch connects the third boost node to the fourth boost node in response to a second switch signal. The fourth switch connects the fourth boost node to an output terminal in response to a third switch signal, thereby providing a high voltage at the output terminal.

The first pump circuit preferably comprises first through fourth transistors and first and second capacitors. The first transistor is diode-connected between a power supply providing the power supply voltage and the first boost node. The first capacitor boosts the first precharge signal. The second transistor is diode-connected between the power supply and the first capacitor. The third transistor is connected between the power supply and the first capacitor and has a gate. The fourth transistor is connected between the power supply and the first boost node. The fourth transistor has a gate connected to the first capacitor. The second capacitor boosts the first pump signal to thereby boost the first boost node.

The second pump circuit preferably comprises first through sixth transistors and first through third capacitors. The first transistor is diode-connected between a power supply and the second boost node. The first capacitor boosts the first pump signal to thereby boost the second boost node. The second transistor is connected between the power supply and the second boost node. The second transistor has a gate receiving a boosted first precharge signal. The third transistor is diode-connected between the power supply and the third boost node. The second capacitor boosts the second precharge signal. The fourth transistor is diode-connected between the power supply and the second capacitor. The fifth transistor is connected between the power supply and the second capacitor. The fifth transistor has a gate connected to the third boost node. The sixth transistor is connected between the power supply and the third boost node. The sixth transistor has a gate connected to the second capacitor. The third capacitor boosts the second pump signal to thereby boost the third boost node.

The third pump circuit preferably comprises first through third transistors and first and second capacitors. The first transistor is diode-connected between a power supply and the fourth boost node. The first capacitor boosts the third precharge signal. The second transistor is diode-connected between the power supply and the output of the first capacitor. The third transistor is connected between the power supply and the first capacitor. The third transistor has a gate connected to the fourth boost node. The second capacitor boosts the third pumping signal to thereby boost the fourth boost node.

The first switch preferably comprises first through third transistors and a capacitor. The capacitor boosts the first switch signal. The first transistor is diode-connected between a power supply and the capacitor. The second transistor is connected between the power supply and the capacitor. The second transistor has a gate connected to a boosted first precharge signal. The third transistor is connected between the second boost node and the third boost node, the third transistor having a gate connected to the capacitor.

The second switch preferably comprises first through third transistors and a capacitor. The capacitor boosts the first switch signal. The first transistor is diode-connected between a power supply and the capacitor. The second transistor is connected between the power supply and the capacitor. The second transistor has a gate connected to a boosted first precharge signal. The third transistor is connected between the first boost node and the fourth boost node, the third transistor having a gate connected to the capacitor.

The third switch preferably comprises first through third transistors and a capacitor. The capacitor boosts the second switch signal. The first transistor is diode-connected between a power supply and the capacitor. The second transistor is connected between the power supply and the capacitor. The second transistor has a gate connected to a boosted second precharge signal. The third transistor is connected between the third boost node and the fourth boost node. The third transistor has a gate connected to the capacitor.

The fourth switch preferably comprises first through fourth transistors and a capacitor. The first transistor is diode-connected between a power supply and the capacitor. The second transistor is connected between the power supply and the capacitor. The second transistor has a gate connected to a boosted third precharge signal. The third transistor is connected between the capacitor and the fourth boost node. The third transistor has a gate connected to the boosted third precharge signal. The fourth transistor is connected between the fourth boost node and the output terminal. The fourth transistor has a gate connected to the capacitor.

The third pump circuit typically comprises a keeper between the power supply an the fourth to prevent the fourth boost node from floating. The keeper typically comprises either a capacitor or a transistor whose length is larger than its width.

The third pump circuit often comprises a charge pump unit comprising a charge compensator. The charge compensator typically comprises first through fourth resistors, first and second comparators, and a transistor. The first resistor has a first end connected to a power supply providing the power supply voltage and a second end. The second resistor has a first end connected to the output terminal and a second end. The first comparator has a first input connected to the second end of the first resistor, a second input connected to the second end of the second resistor, and an output. The third resistor is connected between the second end of the first resistor and the output of the first comparator. The fourth resistor is connected between the second end of the second resistor and ground. The second comparator has a first input connected to the output of the first comparator and a second input connected to the fourth boost node. The transistor is connected between the output terminal and the fourth boost node and the transistor has a gate connected to the output of the second comparator.

Accordingly, a high voltage generating circuit according to the present invention is capable of conserving charge pumped to a node by isolating a current path between a power supply voltage and the node when the power supply voltage is smaller than a voltage apparent at the node, thereby maintaining the pumping efficiency of the high voltage generating circuit. Since the voltage apparent at the node is maintained during a precharge period, the pumping efficiency during subsequent periods is also maintained.

BRIEF DESCRIPTION OF THE DRAWINGS

The accompanying drawings illustrate several selected embodiments of the present invention and are incorporated in and constitute a part of this specification. In the drawings.

DETAILED DESCRIPTION OF THE INVENTION

Figure 1:
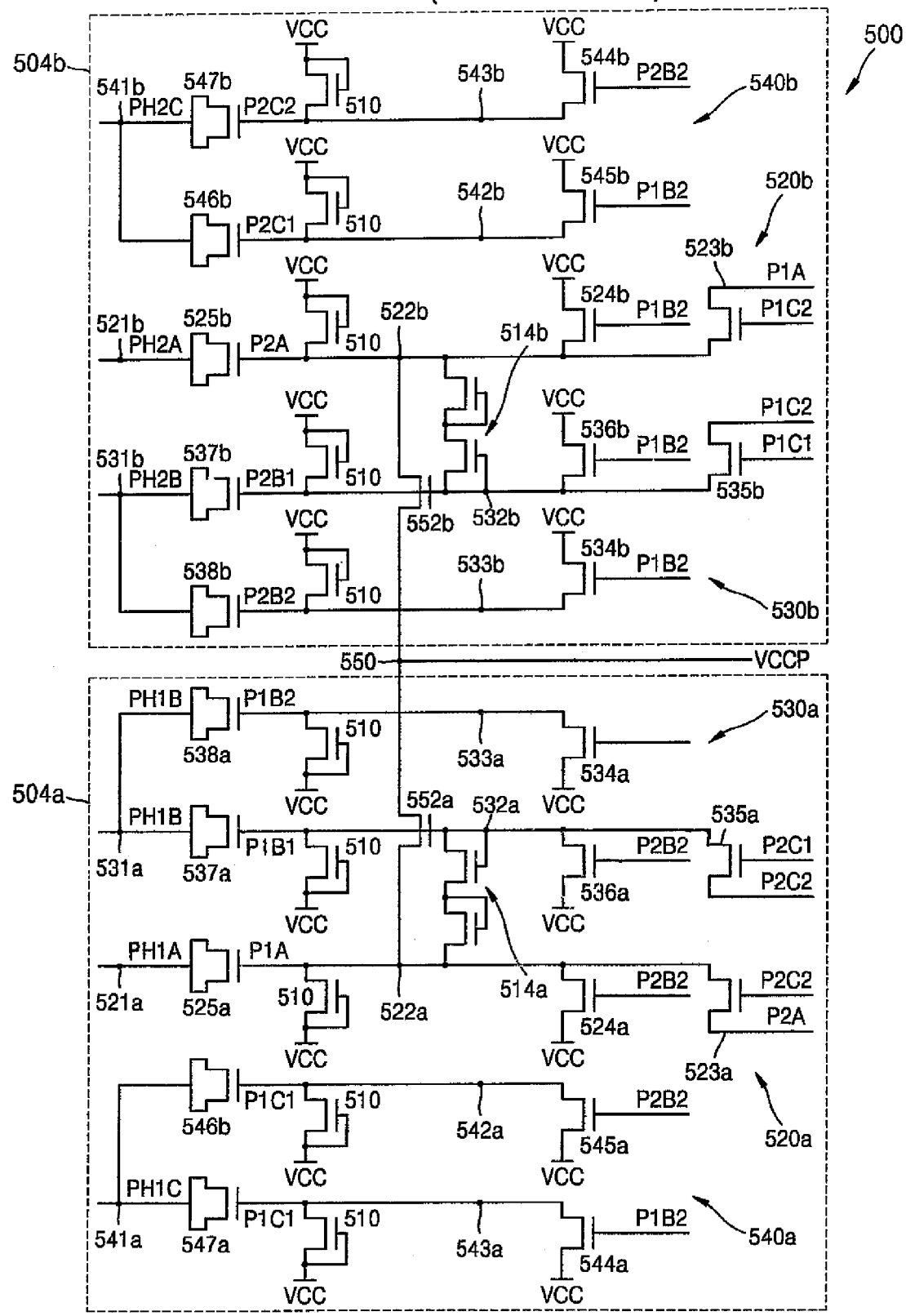
FIG. 1 is a circuit diagram for a conventional high voltage generating circuit.

The present invention will now be described more fully with reference to the accompanying drawings, in which several exemplary embodiments of the present invention are shown. Throughout the drawings and the written disclosure, like reference numerals are used to refer to like elements.

Figure 3:
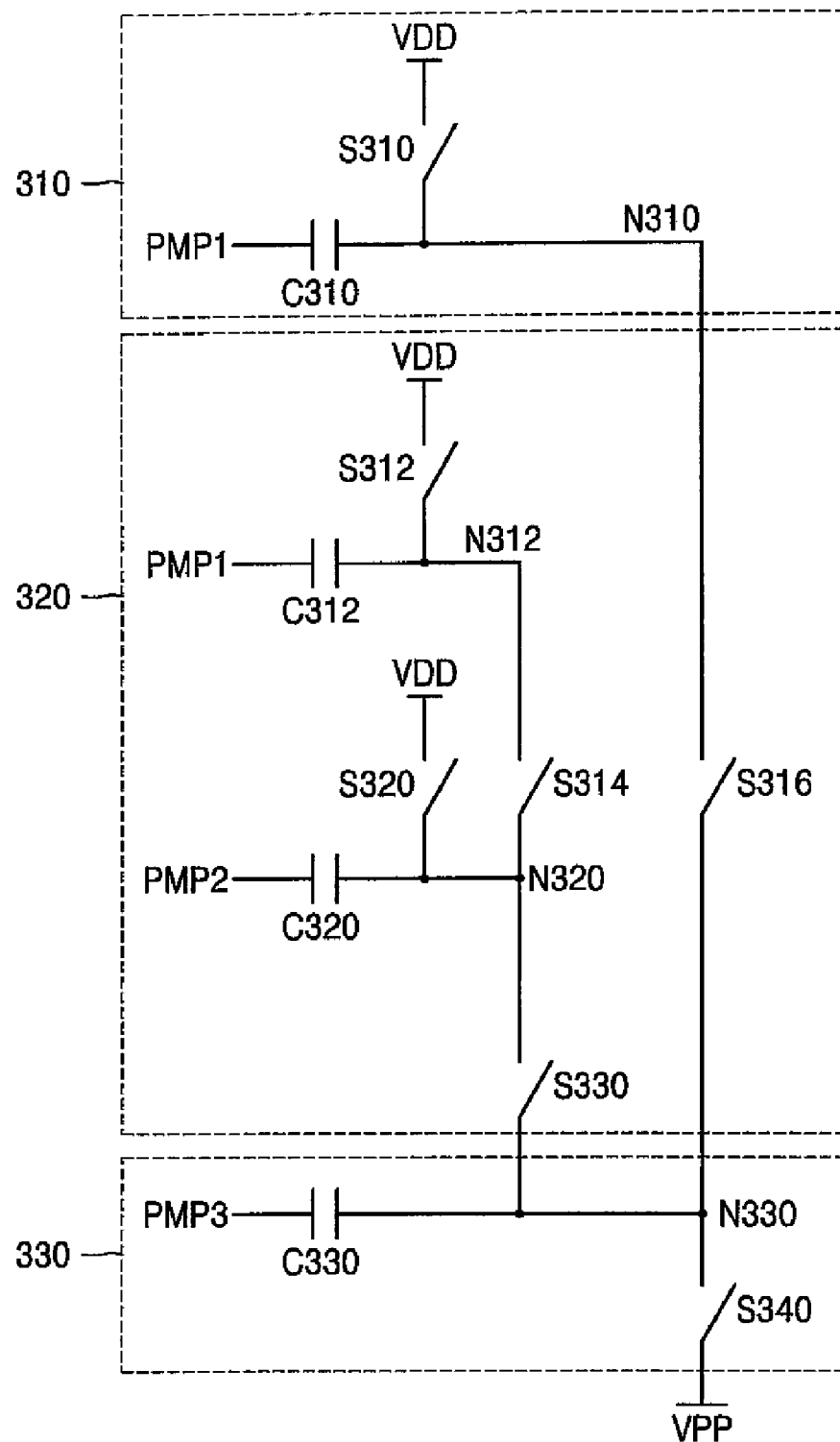
FIG. 3 is a circuit diagram for a high voltage generating circuit according to one embodiment of the present invention.

FIG. 3 is a circuit diagram for a high voltage generating circuit according to one embodiment of the present invention. The high voltage generating circuit in FIG. 3 comprises first through third pump circuits 310, 320, and 330. First through third pump circuits sequentially pump charge in order to generate a high voltage VPP, which is larger than a power source voltage VDD provided by a power source. First through third pump circuits 310, 320, and 330 collectively comprise first through fourth capacitors C310, C312, C320, and C330, first through seventh switches S310, S312, S314, S316, S320, S330, and S340, first through fourth boost nodes N310, N312, N320, and N330, and the power supply.

First pump circuit 310 drives first boost node N310 in response to a first pump signal PMP1. Second pump circuit 320 drives second boost node N312 in response to first pump signal PMP1. Second pump circuit 320 also drives third boost node N320 in response to a second pump signal PMP2. Third pump circuit 330 drives fourth boost node N330 in response to a third pump signal PMP3.

First pump signal PMP1 charges up first and second capacitors C310 and C312, thereby increasing a voltage apparent at first boost node N310 and a voltage apparent at second boost node N312. Second pump signal PMP2 charges up third capacitor C320, thereby increasing a voltage apparent at third boost node N320. Third pump signal PMP3 charges up fourth capacitor C330, thereby increasing a voltage apparent at fourth boost node N330.

Third switch S314 connects second boost node N312 to third boost node N320, thereby further increasing the voltage apparent at third boost node N320. Fourth and sixth switches S316 and S330 connect first and third boost nodes N310 and N320 to fourth boost node N330, thereby further increasing the voltage apparent at fourth boost node N330. Seventh switch S340 connects fourth boost node N330 to an output terminal, thereby providing high voltage VPP at the output terminal. First switch 310 connects first boost node N310 to the power supply and second, third, and fifth switches S312, S314, and S320 connect third boost node N320 to the power supply, thereby precharging first and third boost nodes N310 and N320 to power supply voltage VDD.

Figure 4:
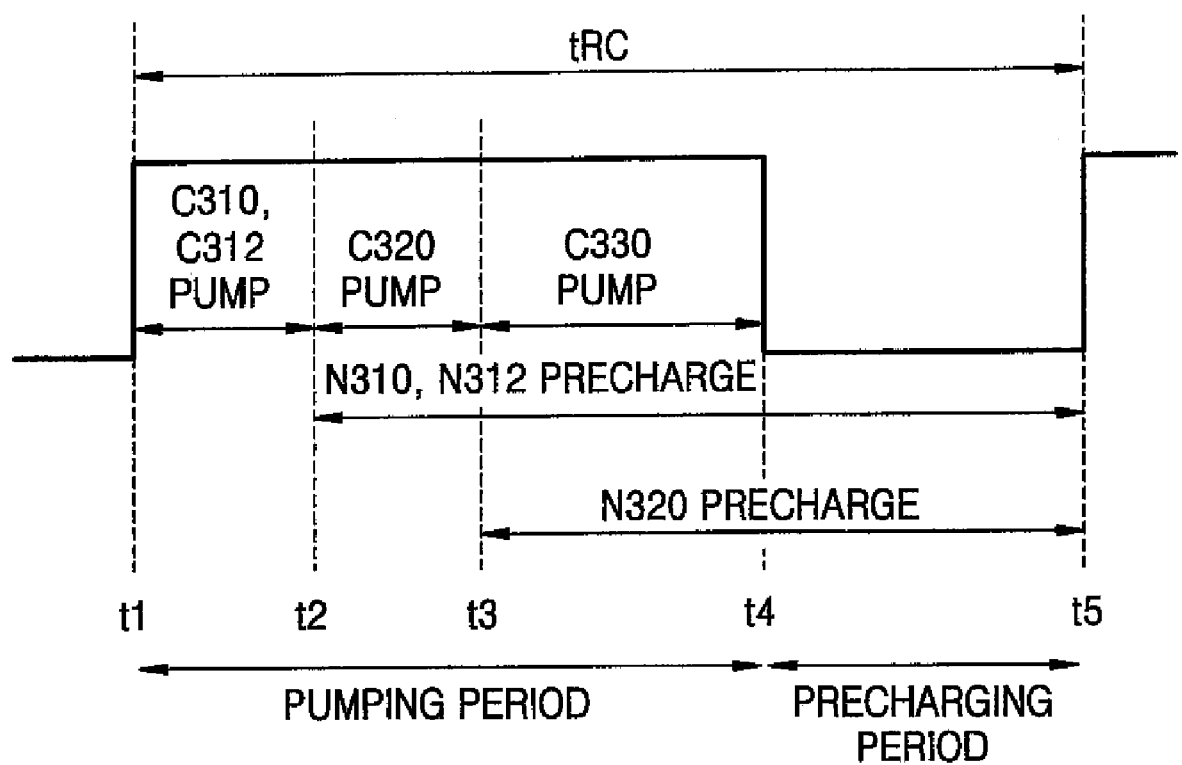
FIG. 4 is a waveform timing diagram illustrating the operation of the high voltage generating circuit in FIG. 3.

FIG. 4 is a waveform timing diagram illustrating the operation of the high voltage generating circuit in FIG. 3.

Referring to FIG. 4, charge pumping and precharging are performed during a low-cycle period tRC. A first pumping period occurs between times t1 and t2, a second pumping period occurs between times t2 and t3, a third pumping period occurs between times t3 and t4, and a precharging period occurs between times t4 and t5. During the first pumping period, charge is pumped by first and second capacitors C310 and C312 in response to first pump signal PMP1. During the second pumping period, charge is pumped by third capacitor C320 in response to second pump signal PMP2. During the third pumping period, charge is pumped by fourth capacitor C330 in response to third pump signal PMP3. During a period between times t2 and t5, first and second boost nodes N310 and N312 are precharged by the power supply via first and second switches S310 and S312. During a period between times t3 and t5, third boost node N320 is precharged by the power supply via switch S320.

Figure 5:
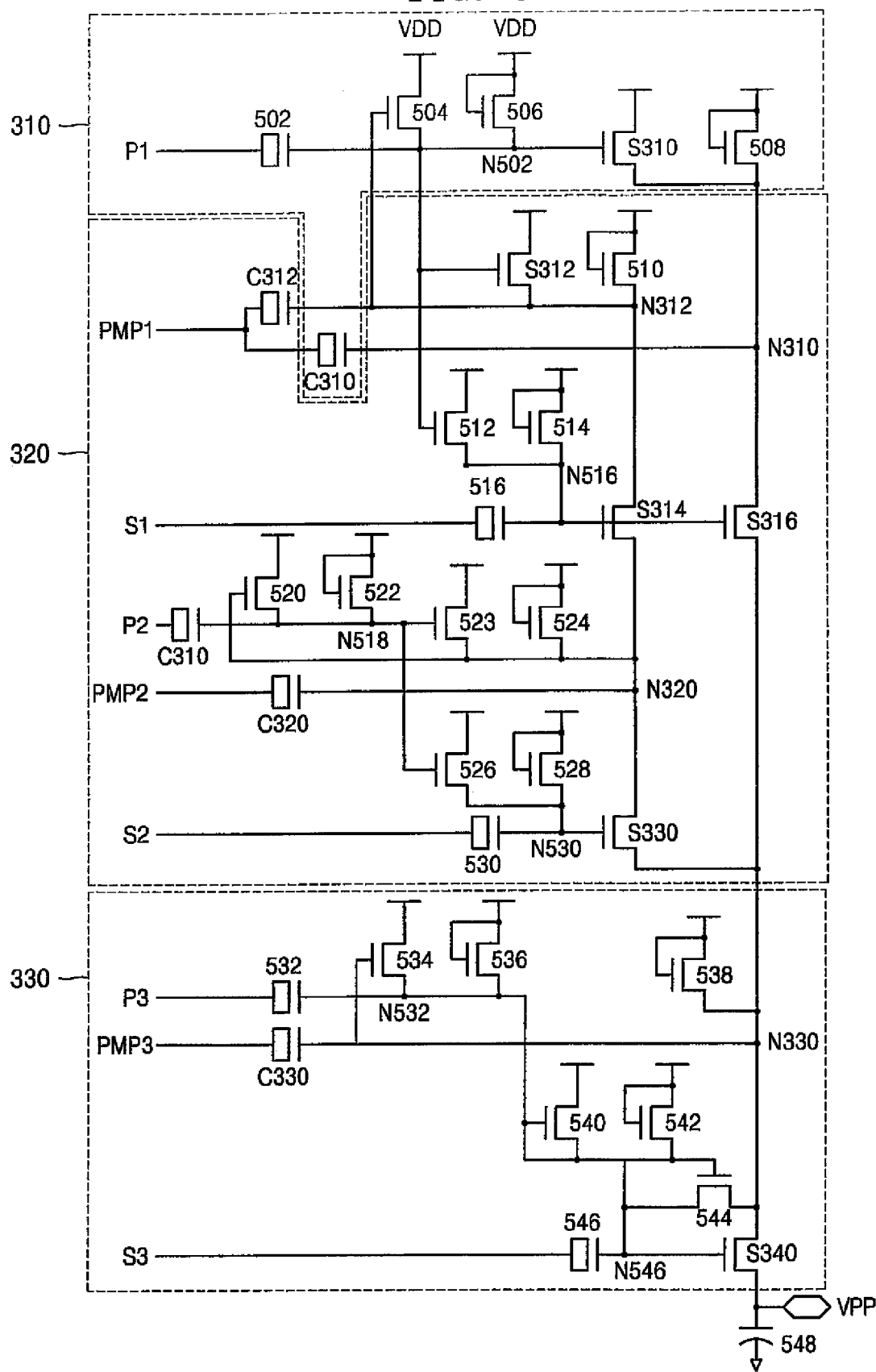
FIG. 5 is a circuit diagram for a high voltage generating circuit according to another embodiment of the present invention.

FIG. 5 is a circuit diagram for a high voltage generating circuit according to another embodiment of the present invention.

Referring to FIG. 5, nodes N502 and N310 are respectively precharged to a voltage VDD-Vt through transistors 506 and 508, which are diode-connected to a power supply having a power supply voltage VDD. Node N502 is boosted by a capacitor 502, which is charged up by a first precharge signal P1, where precharge signal P1 has a high logic level providing power supply voltage VDD. Node N310 is further precharged by a transistor S310 connected to the power supply. The gate of transistor S310 is connected to node N502. Node N310 is boosted by a capacitor C310, which is charged up by first pump signal PMP1. First pump signal PMP1 has a high logic level providing power supply voltage VDD.

A node N312 in second pump circuit 320 is precharged to voltage VDD-Vt by a transistor 510, which is diode-connected to the power supply. Node N312 is further precharged by a transistor S312, which is connected to the power supply and whose gate is connected to node N502. N502 is further precharged by a transistor 504, which is connected to the power supply and whose gate is connected to node N312. Node N312 is further boosted by a second capacitor C312, which is charged up by first pump signal PMP1.

A node N516 is precharged to voltage VDD-Vt through a transistor 514, which is diode-connected to the power supply. Node N516 is further precharged through a transistor 512, which is connected to the power supply and whose gate is connected to node N502. Node N516 is boosted by a capacitor 516, which is charged up by a first switch signal S1. First switch signal S1 has a high logic level providing power supply voltage VDD. Nodes N312 and N310 are respectively discharged into nodes N320 and N330 through transistors S314 and S316, whose gates are connected to node N516.

A node N518 is precharged to power supply voltage VDD through a transistor 522, which is diode-connected to the power supply. Node N518 is further precharged through a transistor 520, which is connected to the power supply and whose gate is connected to node N320. Node N518 is boosted by capacitor C310, which is charged up by a second precharge signal P2, where second precharge signal P2 has a high logic level providing power supply voltage VDD.

A third boost node N320 is precharged to voltage VDD-Vt through a transistor 524 that is diode-connected to the power supply. Third boost node N320 is further precharged through a transistor 523, which is connected to the power supply and whose gate is connected to node N518. Third boost node N320 is boosted by a capacitor C320 that is charged up by second pump signal PMP2, where second pump signal PMP2 has a high logic level providing power supply voltage VDD.

A node N530 is precharged to voltage VDD-Vt through a transistor 528 that is diode-connected to the power supply. Node N530 is further precharged through a transistor 526, which is connected to the power supply and whose gate is connected to node N518. Node N530 is boosted by a capacitor 530 that is charged up by second switch signal S2, where second switch signal S2 has a high logic level providing power supply voltage VDD. A voltage apparent at node N530 causes a transistor S330 to turn on, thus discharging node N320 into a node N330 through a transistor S330, whose gate is connected to node N530.

A node N532 in third pump circuit 330 is precharged to voltage VDD-Vt through a transistor 536 that is diode-connected to the power supply. Node N532 is further precharged through a transistor 534, which is connected to the power supply and whose gate is connected to node N330. Node N532 is boosted by a capacitor 532 that is charged up by a third precharge signal P3. Third precharge signal P3 has a high logic level providing power supply voltage VDD.

A node N546 is precharged to voltage VDD-Vt through a transistor 542 that is diode-connected to the power supply. Node N546 is further precharged through a transistor 540, which is connected to the power supply and whose gate is connected to node N532. Node N546 is boosted by a capacitor 546, which is charged up by a third switch signal S3, where switch signal has a high logic level providing power supply voltage VDD. Node N546 is discharged into node N330 through transistor 544, whose gate is connected to the node N532.

Node N330 is precharged to voltage VDD-Vt through a transistor 538 that is diode-connected to the power supply. Node N330 is boosted by a capacitor C330 that is charged up by a third pump signal PMP3. Third pump signal PMP3 has a high logic level providing power supply voltage VDD. A voltage apparent at node N330 allows a transistor S340, whose gate is connected to node N546, to generate high voltage VPP at an output terminal of the high voltage generating circuit.

Figure 6A:
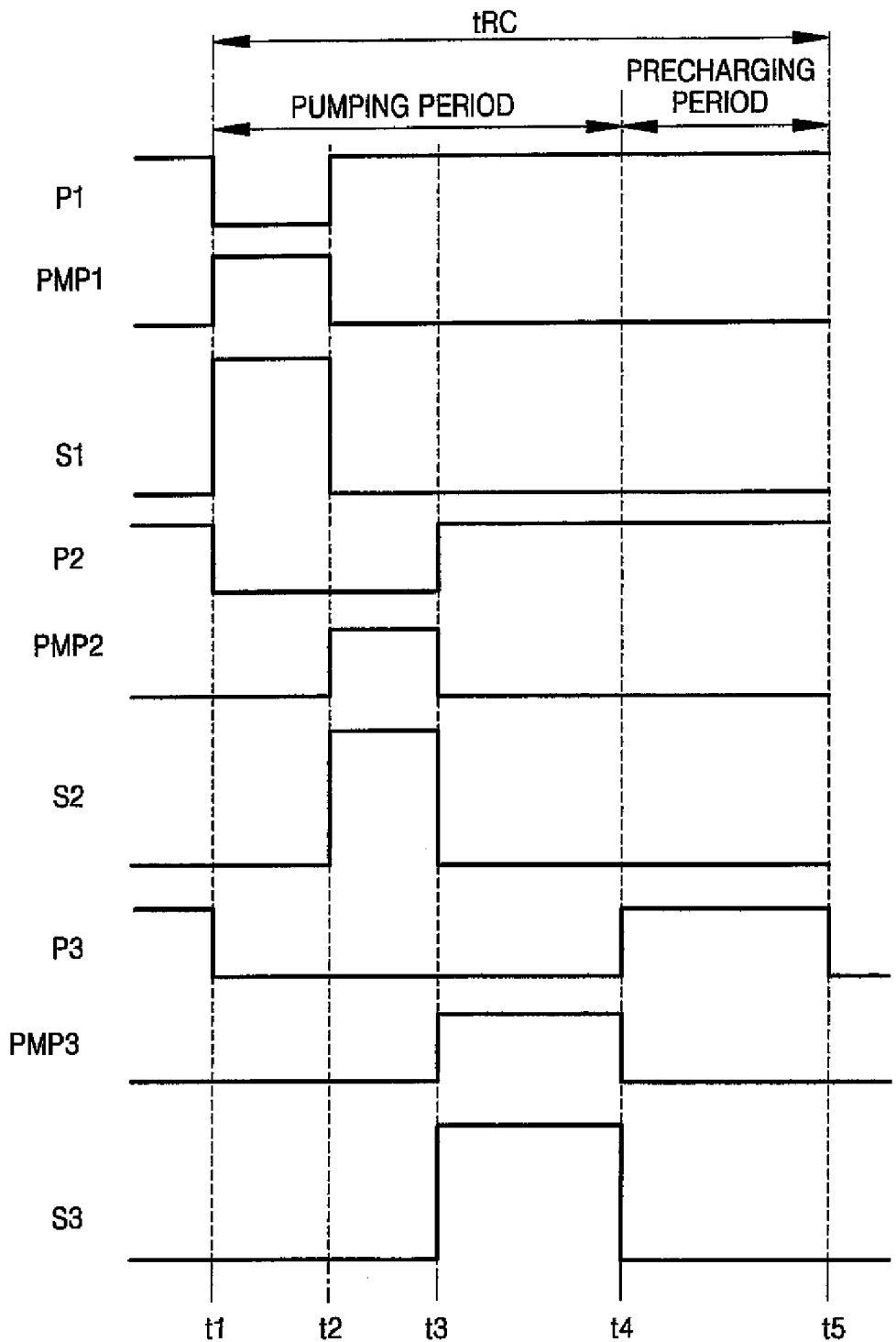
FIGS. 6A and 6B are waveform timing diagrams illustrating the operation of the high voltage generating circuit in FIG. 5.
Figure 6B:
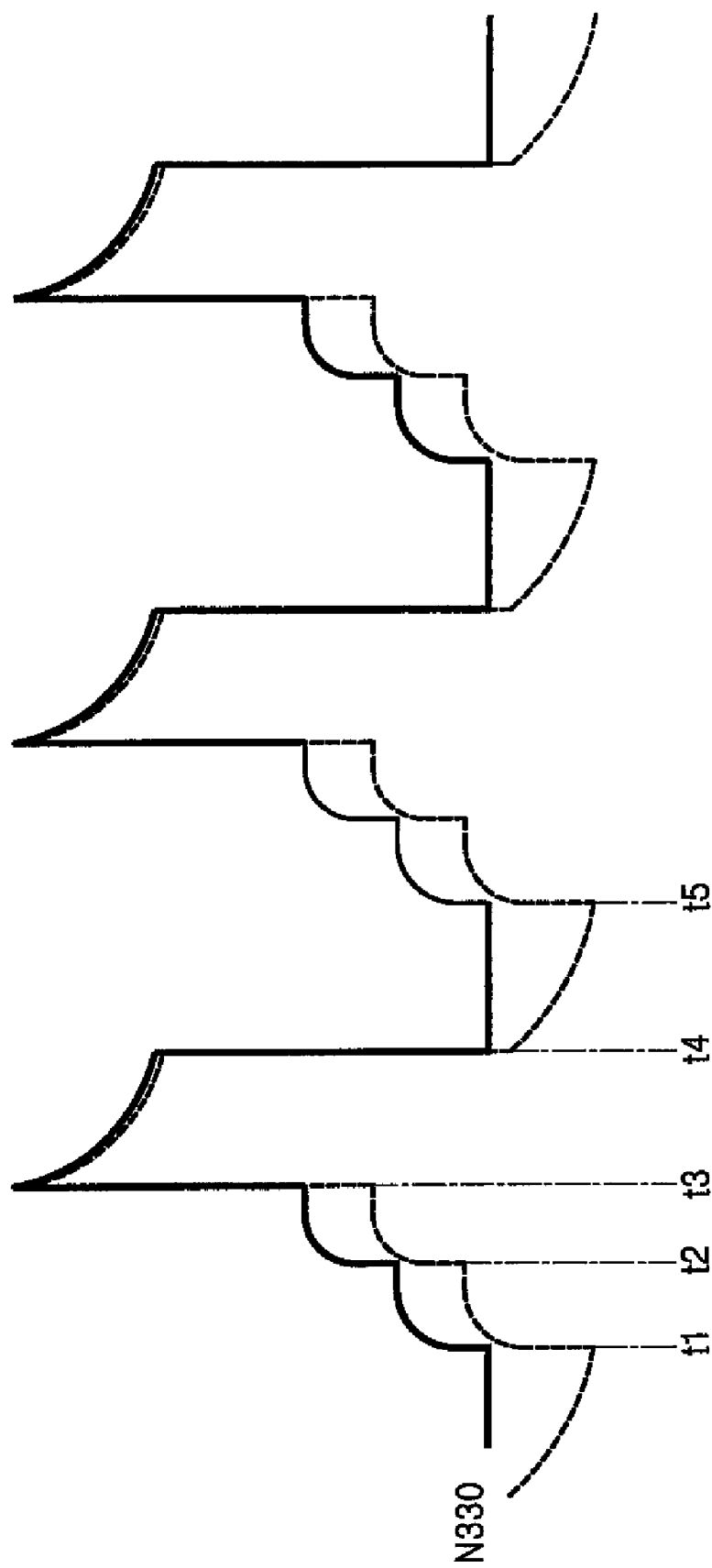

FIGS. 6A and 6B are waveform timing diagrams illustrating the operation of the high voltage generating circuit in FIG. 5. Referring to FIGS. 5 and 6A, nodes N310 and N312 are respectively boosted by capacitors C310 and C312 between times t1 and t2 in response to a rising edge of first pump signal PMP1. At the same time, nodes N310 and N312 are respectively discharged into nodes N330 and N320 through transistors S316 and S314, which are turned on by first switch signal S1. The interval between times t1 and t2 is a first pumping period during which charge is pumped into node N330.

Node N320 is boosted by third capacitor C320 in response to a rising edge of second pump signal PMP2 between times t2 and t3. At the same time, node N320 is boosted through transistor S330, which is switched on by second switch signal S2. As a result, node N330 is boosted. The interval between the times t2 and t3 is a second pumping period during which charge is pumped into node N330.

Node N330 is boosted through capacitor C330 in response to a rising edge of third pump signal PMP3 between times t3 and t4. The interval between times t3 and t4 is a third pumping period during which charge is pumped into node N330. The voltage apparent at node N330 allows transistor S340 to generate high voltage VPP at the output terminal of the high voltage generating circuit.

At time t2, first precharge signal P1 assumes a high logic level, thus switching on transistors S310 and 512, thereby precharging nodes N310 and N312 to power supply voltage VDD. At time t3, second precharge signal P2 assumes a high logic level, thus switching on transistor 523, thereby precharging node N320 to power supply voltage VDD.

Figure 2:
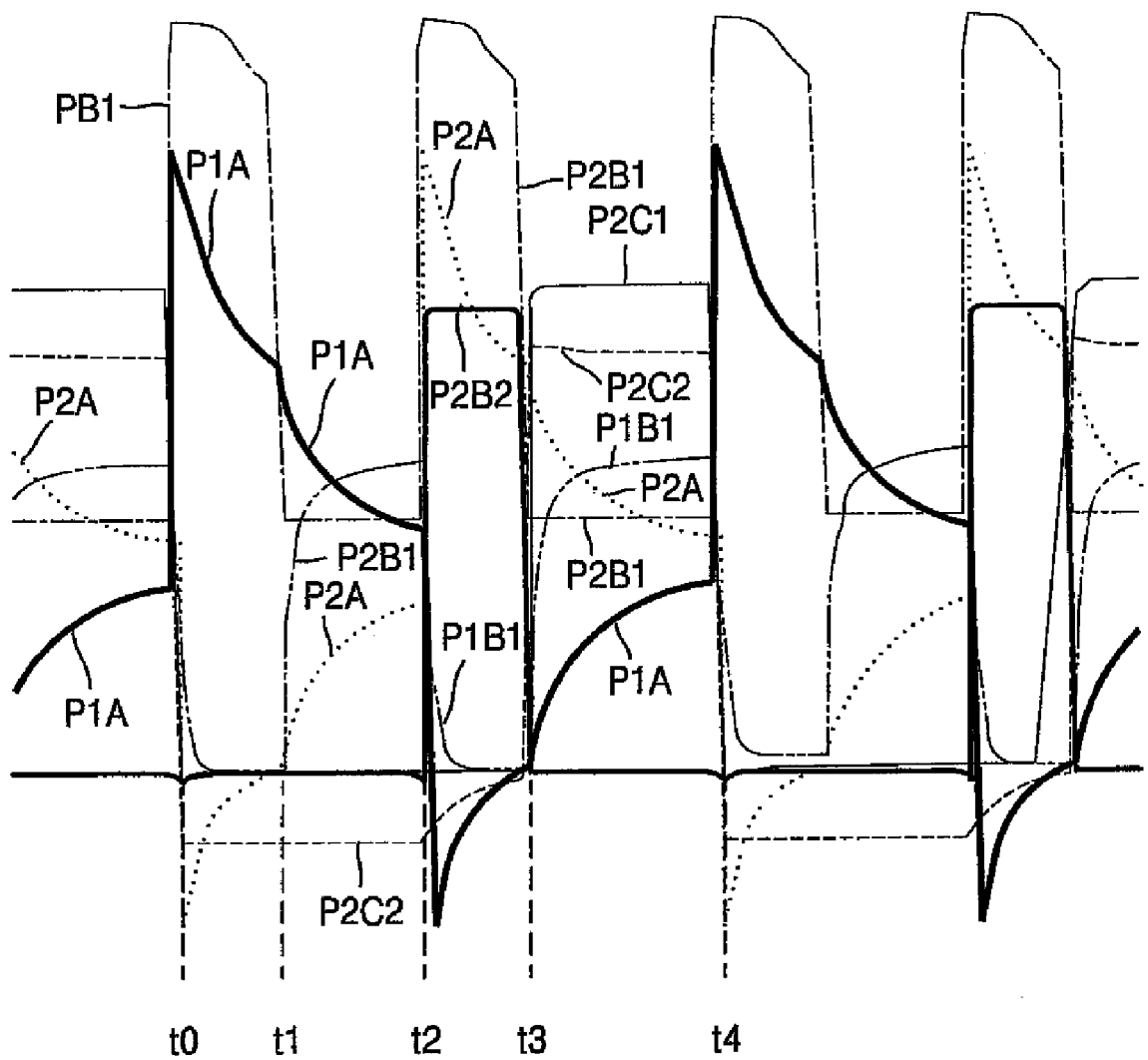
FIG. 2 is a waveform timing diagram illustrating the operation of the conventional high voltage generating circuit in FIG. 1.

Referring to FIG. 6B, a solid line shows a voltage apparent at node N330 in FIG. 5. The voltage apparent at node N330 is boosted in three pumping steps. The first pumping step occurs between times t1 and t2, the second pumping step occurs between times t2 and t3, and the third pumping step occurs between times t3 and t4. The voltage apparent at node N330 remains constant between times t4 and t5. In contrast, as previously described with reference to FIGS. 1 and 2, between times t2 and t3, boost node P1A is discharged into output node VCCP and precharged to power supply voltage VCC. However, since a voltage apparent at boost node P1A is larger than power supply voltage VCC, the voltage apparent at boost node P1A is reduced to power supply voltage VCC and charge pumping is reinitiated, thus lowering pumping efficiency, as indicated by a dotted line in FIG. 6B. The three pumping steps shown in FIG. 6B overcome this problem of the conventional high voltage generating circuit.

Figure 7:
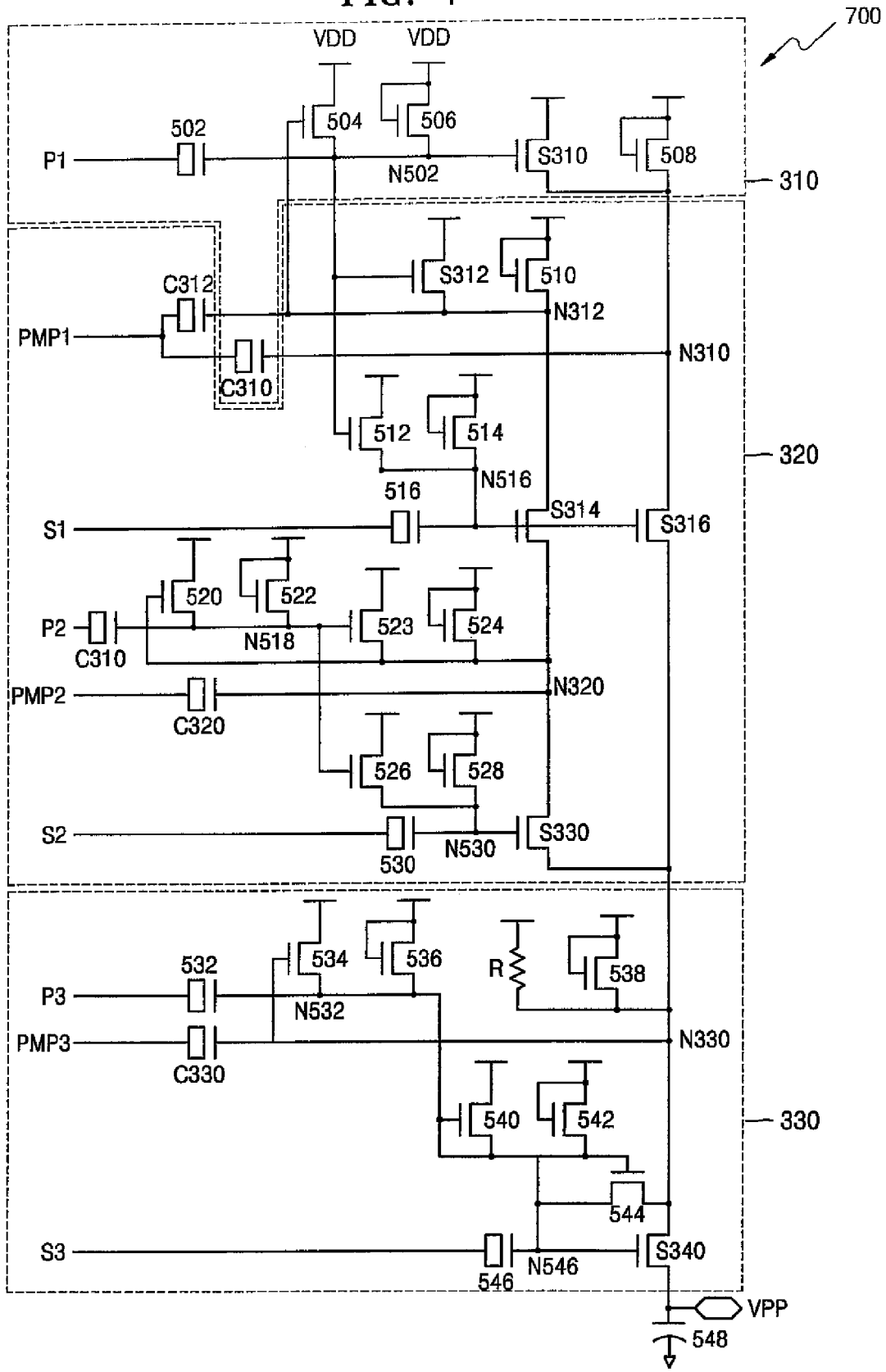
FIG. 7 is a circuit diagram for a high voltage generating circuit according to still another embodiment of the present invention.

FIG. 7 is a circuit diagram for a high voltage generating circuit 700 according to another embodiment of the present invention. High voltage generating circuit 700 is identical to the high voltage generating circuit in FIG. 5, except that in high voltage generating circuit 700 a resistor R is connected between the power supply voltage and node N330 in third pump circuit 330. Resistor R acts to prevent a current path from being formed between node N330 and the power supply. A transistor having a length larger than its width may be substituted for resistor R. Resistor R or transistor are called a keeper because they keep the voltage apparent at node N330 from floating.

Figure 8:
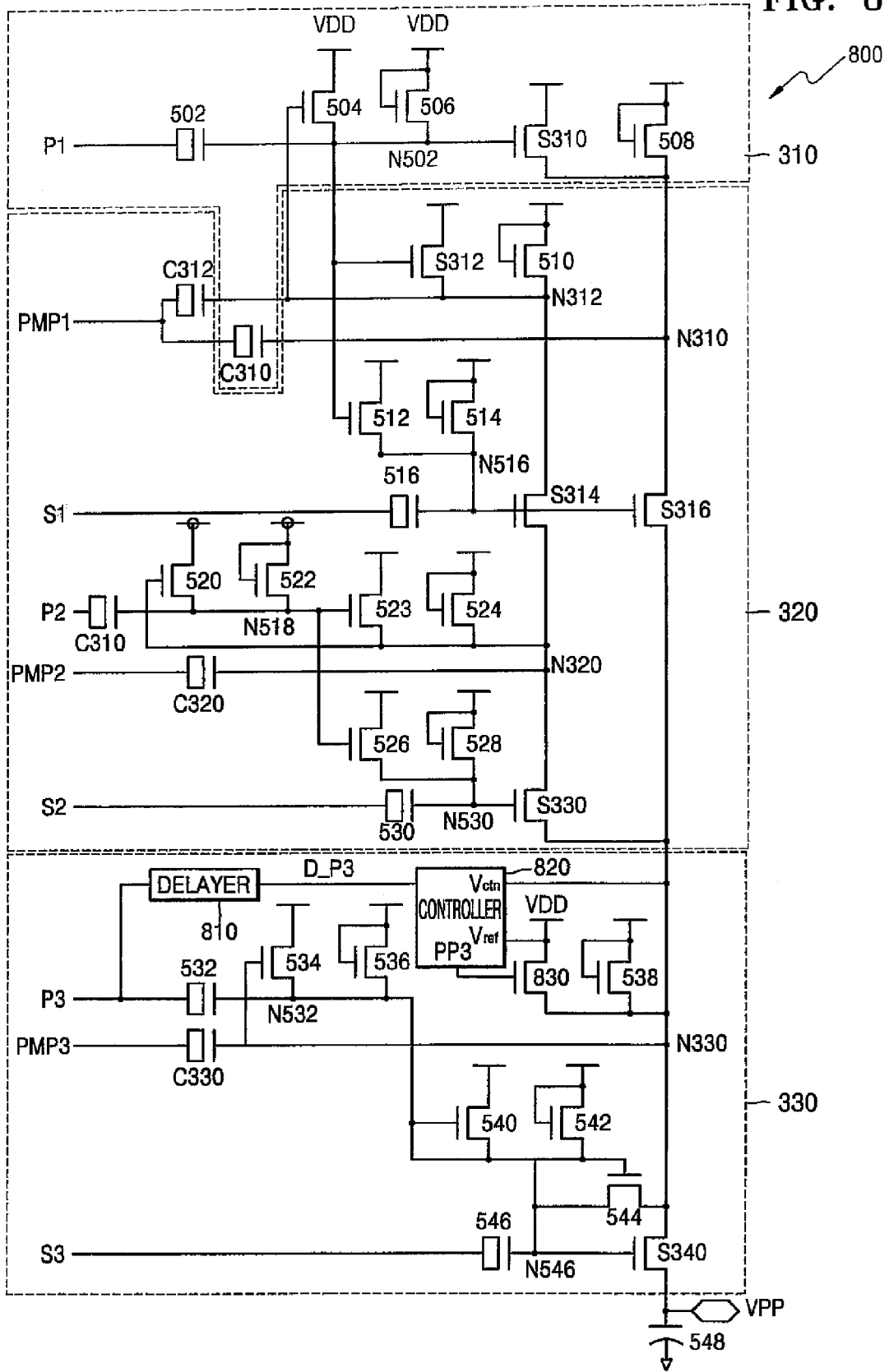
FIG. 8 is a circuit diagram for a high voltage generating circuit according to still another embodiment of the present invention.

FIG. 8 is a circuit diagram for a high voltage generating circuit 800 according to still another embodiment of the present invention. High voltage generating circuit 800 is identical to the high voltage generating circuit in FIG. 5, except that in high voltage generating circuit 800, third pump circuit 330 further comprises a delayer 810, a controller 820, and a precharge transistor 830.

Delayer 810 generates a delayed third precharge signal D_P3 by delaying third precharge signal P3 for a predetermined period of time. Controller 820 compares the voltage apparent at node N330 and power supply voltage VDD and provides the result of the comparison as a precharge control signal PP3 in response to delayed third precharge signal D_P3. Precharge control signal PP3 is applied to the gate of precharge transistor 830, which is connected between the power supply and node N330.

Figure 9:
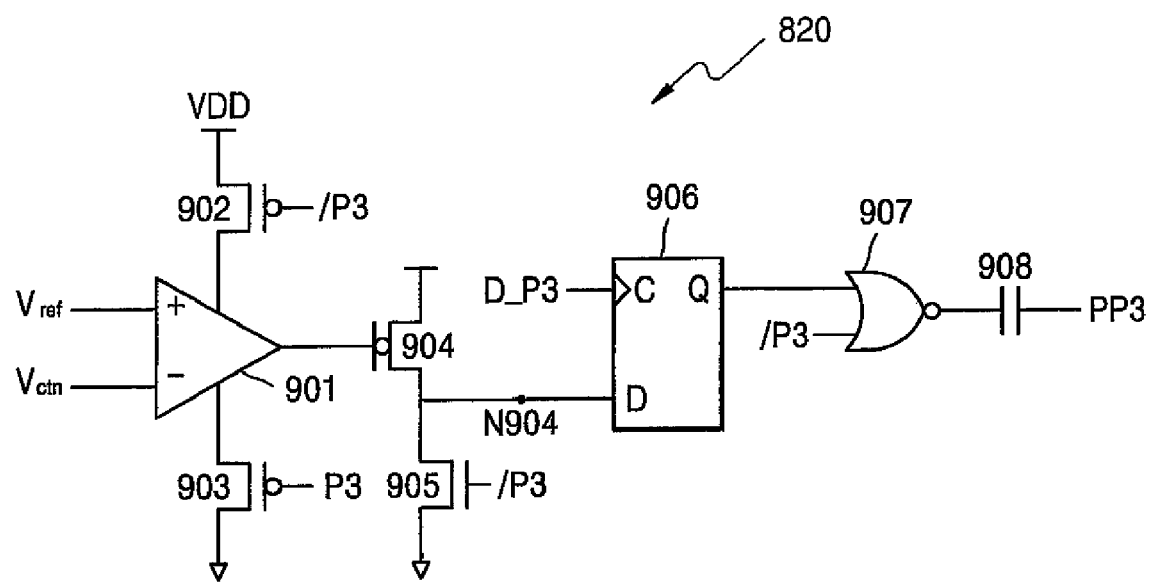
FIG. 9 is a circuit diagram for a controller shown in FIG. 8.

FIG. 9 is a circuit diagram for controller 820.

Figure 10:
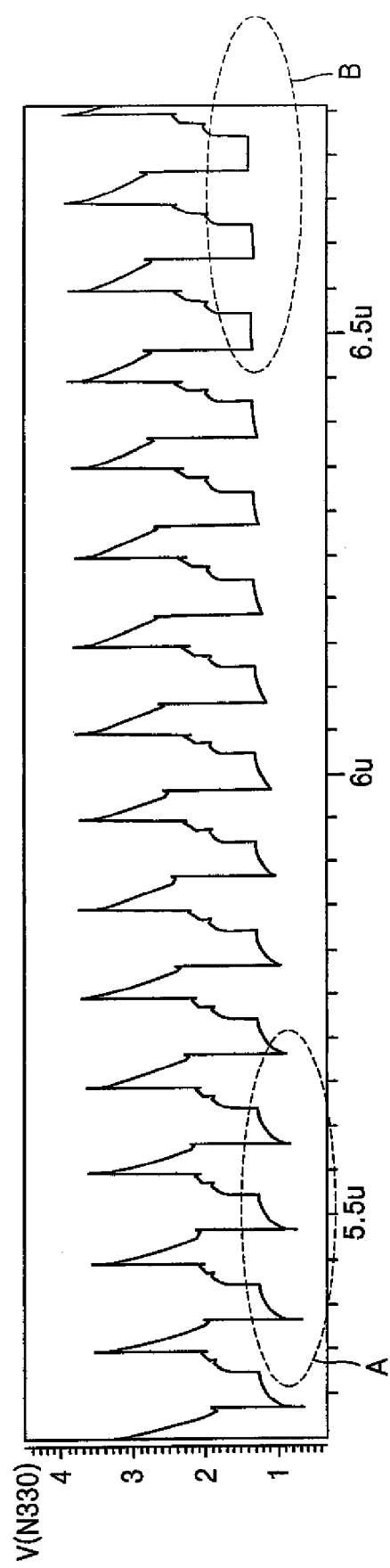
FIG. 10 is a waveform timing diagram illustrating the operation of the controller in FIG. 9.

Referring to FIG. 9, controller 820 comprises a comparator 901 comparing a reference voltage Vref and a control voltage Vctn and providing an output. Reference voltage Vref is provided by the power supply and control voltage Vctn is provided by node N330. Controller 820 further comprises a first PMOS transistor 902 and a first NMOS transistor 903 enabling comparator 901. Controller 820 further comprises a second PMOS transistor 904 receiving the output of comparator 901 and a second NMOS transistor 905 receiving an inverted third precharge signal /P3. Comparator 820 further comprises a flipflop 906 latching a signal apparent at a controller node N904 between second PMOS transistor 904 and second NMOS transistor 905 in response to delayed third precharge signal D_P3 and providing an output. Comparator 820 further comprises a NOR gate 907 receiving the output of flipflop 906 and inverted third precharge signal /P3 and providing an output, and a capacitor 908 receiving the output of NOR gate 907 and providing precharge control signal PP3.

Where third precharge signal P3 has a low logic level, second NMOS transistor 905 is turned on in response to inverted third precharge signal /P3, thus forcing the signal apparent at controller node N904 to assume a low logic level. Alternatively, where third precharge signal P3 has a high logic level, respective first PMOS and NMOS transistors 902 and 903 are turned on, thus connecting comparator 901 between the power supply and ground, thereby enabling comparator 901. Under these conditions, the value of the signal apparent at controller node N904 depends on the output of comparator 901.

Where the output of comparator 901 has high logic level, i.e., where comparator 901 is enabled and reference voltage Vref is larger than control voltage Vctn, second PMOS transistor 904 and second NMOS transistor 905 are turned off. As a result, the signal apparent at controller node N904 has a low logic level. Since flipflop 906 latches the signal apparent at controller node N904 in response to delayed third precharge signal D_P3, the output of flipflop 906 therefore has a low logic level. Consequently, the output of NOR gate 907, which receives the output of flipflop 906 and inverted third precharge signal /P3, has a high logic level. Therefore, precharge control signal PP3 provided via capacitor 908 has a high logic level.

Where precharge control signal PP3 has a high logic level, precharge transistor 830 is turned on. Where precharge transistor 830 is turned on and power supply voltage VDD is larger than the voltage apparent at node N330, a current path is formed between the power supply and node N330, thereby precharging node N330 to power source voltage VDD as illustrated by a portion "A" in FIG. 10.

Where the output of comparator 901 has a low logic level, i.e. where reference voltage Vref is smaller than control voltage Vctn, second PMOS transistor 904 is turned on. Where second PMOS transistor 904 is turned on and second NMOS transistor 905 is turned off, the signal apparent at controller node N904 has a high logic level. Since flipflop 906 latches the signal apparent at controller node N904 in response to delayed third precharge signal D_P3, the output of flipflop 906 has a low logic level. Consequently, the output of NOR gate 907, which receives the output of flipflop 906 and inverted third precharge signal, has a low logic level. Therefore, precharge control signal PP3 provided via capacitor 908 has a low logic level, and as a result, precharge transistor 830 is turned off.

According to the description of controller 820 given above, precharge transistor 830 is turned off whenever voltage VDD is smaller than the voltage apparent at node N330, thereby preventing a current path from being formed between node N330 and the power supply. Accordingly, node N330 is not discharged and the voltage at the node N330 is maintained constant, as illustrated by a portion "B" in FIG. 10.

Figure 11:
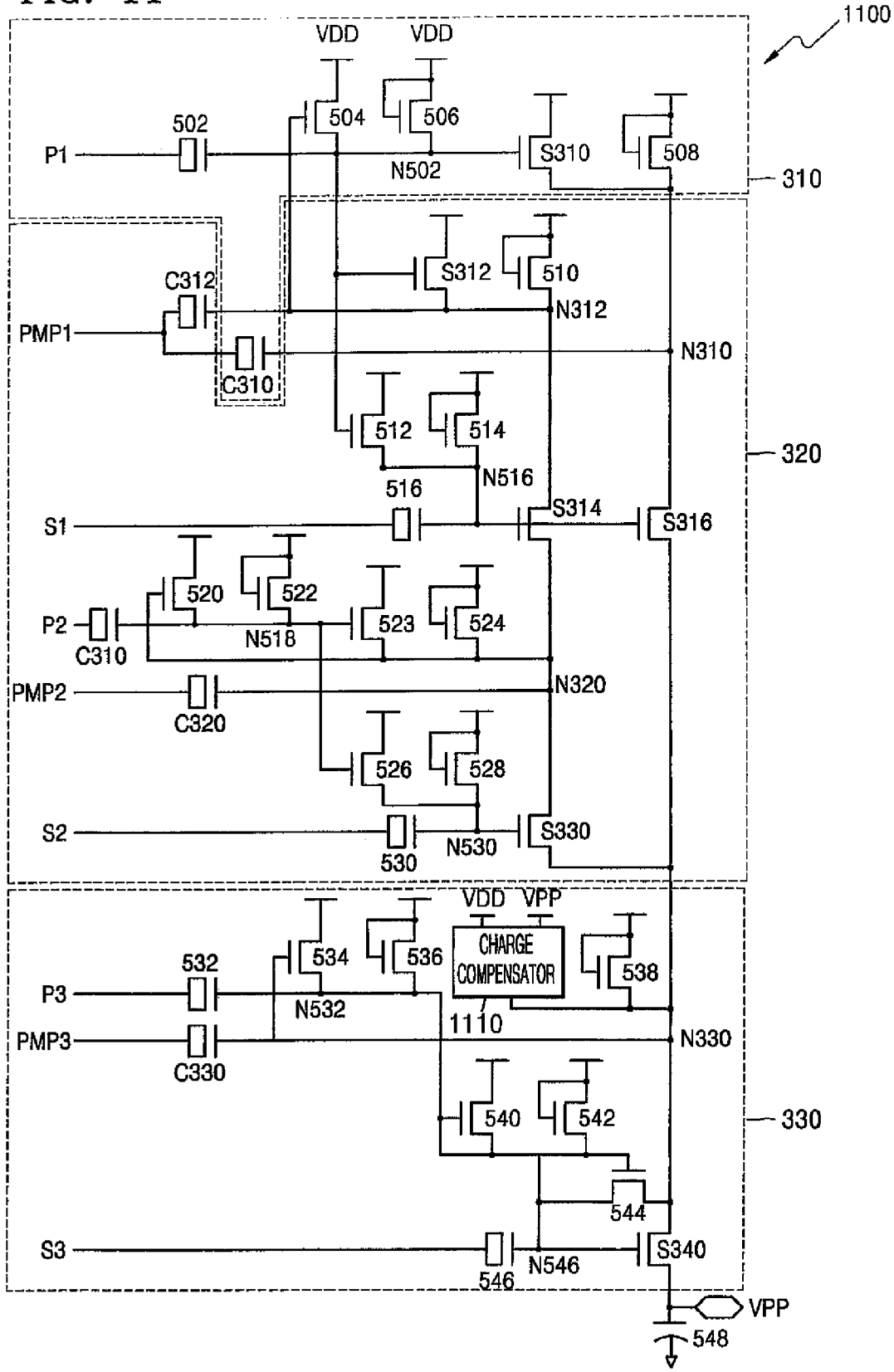
FIG. 11 is a circuit diagram for a high voltage generating circuit according to still another embodiment of the present invention.

FIG. 11 is a circuit diagram for a high voltage generating circuit 1100 according to still another embodiment of the present invention. High voltage generating circuit 1100 is identical to the high voltage generating circuit in FIG. 5, except that high voltage generating circuit 1100 further comprises a charge compensator 1110. Charge compensator 1110 compares the voltage apparent at fourth boost node N330 and a difference VPP−VDD between high voltage VPP and power supply voltage VDD, and determines an amount of charge to be supplied to node N330.

Figure 12:
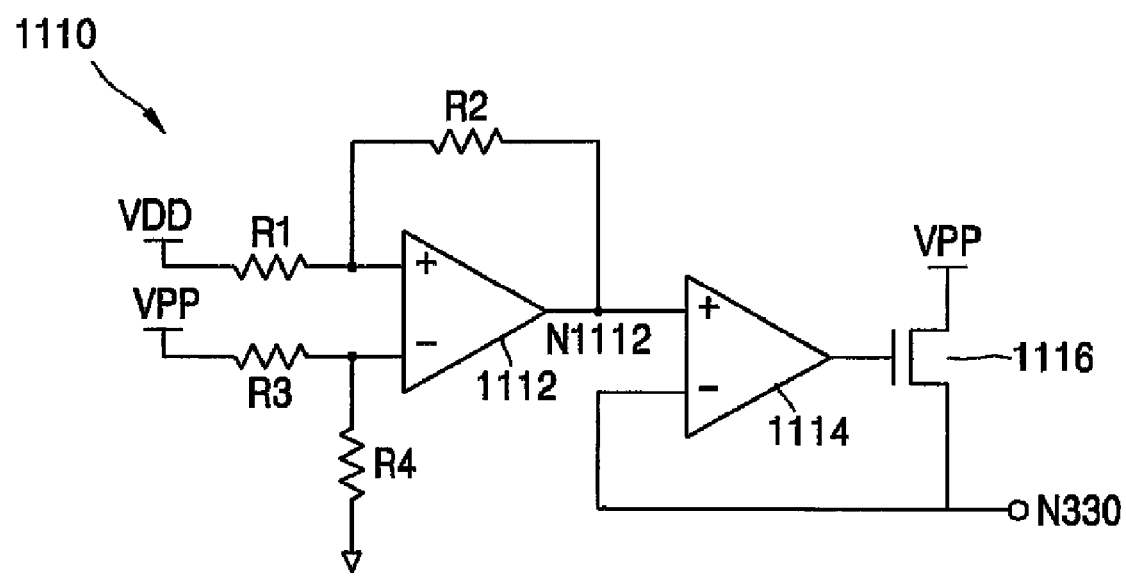
FIG. 12 is a circuit diagram for a charge compensator shown in FIG. 11.

FIG. 12 is a circuit diagram for charge compensator 1110.

Referring to FIG. 12, charge compensator 1110 comprises first through fourth resistors R1, R2, R3, and R4, each having resistance R. Charge compensator 1110 further comprises a first comparator 1112, a second comparator 1114, and an NMOS transistor 1116. A voltage VDD/2 is applied to a first input terminal (+) of first comparator 1112 and a voltage VPP/2 is applied to a second input terminal (−) of first comparator 1112. As a result, a voltage VPP−VDD is output on an output node N1112 of first comparator 1112 according to Kirchhoff's Voltage Law (KVL). Voltage VPP−VDD is applied to a first input terminal (+) of second comparator 1114 and the voltage apparent at node N330 is applied to a second input terminal (−) of second comparator 1114. Second comparator 1114 compares voltage VPP−VDD and the voltage apparent at node N330, and provides an output signal, which is connected to the gate of NMOS transistor 1116.

According to the description of charge compensator 1110 given above, where the voltage apparent at node N330 is smaller than voltage VPP−VDD, the output of second comparator 1114 has a high logic level. Where the output of second comparator 1114 has a high logic level, NMOS transistor 1116 is turned on, thereby providing node N330 with high voltage VPP. Alternatively, where the voltage apparent at node N330 is larger than voltage VPP−VCC, the output of second comparator 1114 has a low logic level, thus turning off NMOS transistor 1116 so as to prevent voltage VPP from being supplied to node N330.

Charge compensator 1110 serves to maintain the voltage apparent at node N330 at a constant level VPP−VDD during precharging. Accordingly, high voltage generating circuit 1100 achieves optimal charge pumping efficiency using first through third pump circuits 310, 320, and 330.

The preferred embodiments disclosed in the drawings and the corresponding written description are teaching examples. Those of ordinary skill in the art will understand that various changes in form and details may be made to the exemplary embodiments without departing from the scope of the present invention which is defined by the following claims.

What is claimed is:

1. A high voltage generating circuit, comprising:
   a first pump circuit precharging a first boost node to a power supply voltage in response to a first precharge signal, and boosting the first boost node in response to a first pump signal;
   a second pump circuit precharging a second boost node to the power supply voltage in response to the first precharge signal, boosting the second boost node in response to the first pump signal, precharging a third boost node in response to a second precharge signal, and boosting the third boost node in response to a second pump signal;
   a third pump circuit selectively precharging a fourth boost node in response to a precharge control signal and boosting the fourth boost node in response to a third pump signal;
   a first switch connecting the second boost node to the third boost node in response to a first switch signal;
   a second switch connecting the first boost node to the fourth boost node in response to the first switch signal;
   a third switch connecting the third boost node to the fourth boost node in response to a second switch signal; and
   a fourth switch connecting the fourth boost node to an output terminal in response to a third switch signal, thereby providing high voltage at the output terminal.

2. The high voltage generating circuit of claim 1, wherein the precharge control signal is generated by a controller, the controller comprising:
   a comparator comparing the power supply voltage to a voltage apparent at the fourth boost node in response to the third precharge signal, the comparator having an output;
   a first transistor connected between a controller node and ground, the first transistor having a gate receiving the third precharge signal;
   a second transistor connected between a power supply providing the power supply voltage and the controller node, the second transistor having a gate connected to the output of the comparator and the power supply;
   a delayer receiving the third precharge signal and delaying it for a predetermined period of time;
   a flipflop latching a signal apparent at the controller node in response to the delayed third precharge signal, the flipflop having an output;
   a logic gate receiving the output of the flipflop and the third precharge signal;
   a capacitor boosting the output of the logic gate; and,
   a third transistor connected between the power supply and the fourth boost node, the third transistor having a gate connected to the capacitor.

3. The high voltage generating circuit of claim 1, wherein the first pump circuit comprises:
   a first transistor diode-connected between a power supply providing the power supply voltage and the first boost node;
   a first capacitor boosting the first precharge signal;
   a second transistor diode-connected between the power supply and the first capacitor;
   a third transistor connected between the power supply and the first capacitor, the third transistor having a gate;
   a fourth transistor connected between the power supply and the first boost node, the fourth transistor having a gate connected to the first capacitor; and,
   a second capacitor boosting the first pump signal to thereby boost the first boost node.

4. The high voltage generating circuit of claim 1, wherein the second pump circuit comprises:
   a first transistor diode-connected between a power supply having the power supply voltage and the second boost node;
   a first capacitor boosting the first pump signal to thereby boost the second boost node;

a second transistor connected between the power supply and the second boost node, the second transistor having a gate receiving a boosted first precharge signal;

a third transistor diode-connected between the power supply and the third boost node;

a second capacitor boosting the second precharge signal;

a fourth transistor diode-connected between the power supply and the second capacitor;

a fifth transistor connected between the power supply and the second capacitor, the fifth transistor having a gate connected to the third boost node;

a sixth transistor connected between the power supply and the third boost node, the sixth transistor having a gate connected to the second capacitor; and, a third capacitor boosting the second pump signal to thereby boost the third boost node.

5. The high voltage generating circuit of claim 1, wherein the third pump circuit comprises:

a first transistor diode-connected between a power supply providing the power supply voltage and the fourth boost node;

a first capacitor boosting the third precharge signal;

a second transistor diode-connected between the power supply and the first capacitor;

a third transistor connected between the power supply and the first capacitor, the third transistor having a gate connected to the fourth boost node; and, a second capacitor boosting the third pumping signal to thereby boost the fourth boost node.

6. The high voltage generating circuit of claim 1, wherein the first switch comprises:

a capacitor boosting the first switch signal;

a first transistor diode-connected between a power supply providing the power supply voltage and the capacitor;

a second transistor connected between the power supply and the capacitor, the second transistor having a gate connected to a boosted first precharge signal; and, a third transistor connected between the second boost node and the third boost node, the third transistor having a gate connected to the capacitor.

7. The high voltage generating circuit of claim 1, wherein the second switch comprises:

a capacitor boosting the first switch signal;

a first transistor diode-connected between a power supply providing the power supply voltage and the capacitor;

the second transistor connected between the power supply and the capacitor, the second transistor having a gate connected to a boosted first precharge signal;

a third transistor connected between the first boost node and the fourth boost node, the third transistor having a gate connected to the capacitor.

8. The high voltage generating circuit of claim 1, wherein the third switch comprises:

a capacitor boosting the second switch signal;

a first transistor diode-connected between a power supply providing the power supply voltage and the capacitor;

a second transistor connected between the power supply and the capacitor, the second transistor having a gate connected to a boosted second precharge signal; and, a third transistor connected between the third boost node and the fourth boost node, the third transistor having a gate connected to the capacitor.

9. The high voltage generating circuit of claim 1, wherein the fourth switch comprises:

a capacitor boosting the third switch signal;

a first transistor diode-connected between a power supply providing the power supply voltage and the capacitor;

a second transistor connected between the power supply and the capacitor, the second transistor having a gate connected to a boosted third precharge signal;

a third transistor connected between the capacitor and the fourth boost node, the third transistor having a gate connected to the boosted third precharge signal; and, a fourth transistor connected between the fourth boost node and the output terminal, the fourth transistor having a gate connected to the capacitor.

10. The high voltage generating circuit of claim 2, wherein the first through third transistors are NMOS transistors.

* * * * *